United States Patent
Marshall et al.

(10) Patent No.: US 6,262,462 B1
(45) Date of Patent: Jul. 17, 2001

(54) ENHANCED DIELECTRIC CONSTANT GATE INSULATOR

(75) Inventors: Daniel S. Marshall, Chandler; Jerald A. Hallmark, Gilbert; William J. Ooms, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/102,191

(22) Filed: Jun. 22, 1998

(51) Int. Cl.[7] ................................................. H01L 29/76
(52) U.S. Cl. ........................ 257/410; 257/295; 257/310; 438/3
(58) Field of Search ................................. 257/295, 310, 257/410; 438/3; 427/126.3, 376.2; 501/134

(56) References Cited

U.S. PATENT DOCUMENTS

| | | | |
|---|---|---|---|
| 5,760,432 | * 6/1998 | Abe et al. | 257/295 |
| 5,796,648 | * 8/1998 | Kawakubo et al. | 365/145 |
| 5,830,270 | * 11/1998 | McKee et al. | 117/106 |
| 5,914,068 | * 6/1999 | Hiratani et al. | 252/62.9 R |
| 5,943,596 | * 8/1999 | Gardner et al. | 438/585 |
| 6,023,082 | * 2/2000 | McKee et al. | 257/295 |
| 6,025,619 | * 2/2000 | Azuma et al. | 257/295 |
| 6,156,623 | * 12/2000 | Hendrix et al. | 438/457 |

OTHER PUBLICATIONS

Choi et al., Study on the Dielectric Properties of (SrCa)TiO3 based Ceramics for the Capacitor Materials, IEEE Proceedings of the 5th International Conference on Properties and Applications of Dielectric Materials, pp. 900–902, May 1997.*

Choi et al., Dielectric Properties and Microstructure of (SrCa)TiO3 based Boundary Layer Capacitor Materials, IEEE Proceedings of the 4th International Conference on Properties and Applications of Dielectric Materials, pp. 286–289, Jul. 1994.*

* cited by examiner

*Primary Examiner*—Eddie Lee
*Assistant Examiner*—George C. Eckert, II
(74) *Attorney, Agent, or Firm*—Eugene A. Parsons; William E. Koch

(57) ABSTRACT

A field effect transistor with an enhanced dielectric constant gate insulator including spaced apart source and drain terminals positioned on a substrate structure so as to define a gate area therebetween. A layer of laterally strained, enhanced dielectric constant dielectric material is epitaxially grown on the substrate structure in the gate area, and a gate metal is positioned on the layer of dielectric material to form a gate terminal in the gate area.

8 Claims, 1 Drawing Sheet

ENHANCED DIELECTRIC CONSTANT GATE INSULATOR

FIELD OF THE INVENTION

The present invention pertains to field effect transistors with insulated gates and more specifically to methods of forming the insulated gates with enhanced dielectric constant material.

BACKGROUND OF THE INVENTION

Field effect transistors (FETs) with insulated gates are in great use in the industry because of the low power consumed in the OFF state and because of the ease of manufacturing these devices in integrated circuits. However, as the size of the devices, and especially the gates, decreases to reduce the size of the device (to improve density) and to increase frequency response, the characteristics of the devices are harder to maintain. Specifically, as the gate insulating layer is reduced in size, leakage current increases, breakdown voltage decreases, and/or the ON resistance increases.

Thus, it would be highly advantageous to provide FETs that overcome these problems.

It is a purpose of the present invention to provide a new method of manufacturing enhanced dielectric constant dielectric material for FET gates.

It is another purpose of the present invention to provide a new method of fabricating dielectric material with lateral strain that increases the dielectric constant.

It is still another purpose of the present invention to provide a new method of fabricating a high dielectric constant (CaSr)TiO$_3$ on a silicon substrate in a FET gate.

It is a further purpose of the present invention to provide a new and improved enhanced dielectric constant dielectric material in a FET gate.

It is still a further purpose of the present invention to provide a new and improved high dielectric constant (CaSr)TiO$_3$ epitaxially grown on a silicon substrate in a FET gate.

SUMMARY OF THE INVENTION

The above problems and others are at least partially solved and the above purposes and others are realized in a field effect transistor with an enhanced dielectric constant gate insulator and methods of fabrication. The transistor includes spaced apart source and drain terminals positioned on a substrate structure so as to define a gate area therebetween. A layer of laterally strained (i.e. parallel to the surface of the substrate structure), enhanced dielectric constant dielectric material is epitaxially grown on the substrate structure in the gate area, and a gate metal is positioned on the layer of dielectric material to form a gate terminal in the gate area.

The dielectric constant of the dielectric material is, for example, increased by adjusting the stoichiometry of the layer of dielectric material during epitaxial growth of the dielectric material to provide the lateral strain. In a specific example, a silicon substrate is provided and a layer of (CaSr)TiO$_3$ is epitaxially grown on the surface.

BRIEF DESCRIPTION OF THE DRAWINGS

Referring to the drawings.

DESCRIPTION OF THE PREFERRED EMBODIMENTS

Figure 1:
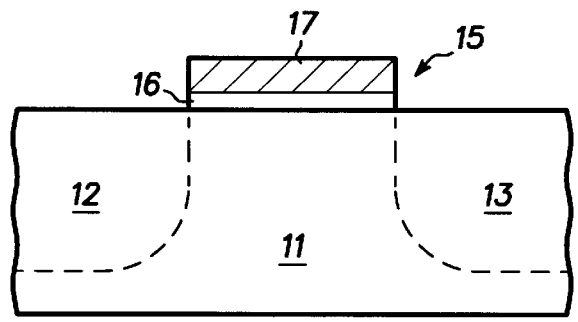
FIG. 1 is a simplified sectional view of a field effect transistor in accordance with the present invention.

Turning now to the drawings and specifically FIG. 1, a field effect transistor (FET) 10 is illustrated as being fabricated on/in a substrate structure 11 and including a source 12, a drain 13, and a gate 15. Gate 15 includes a gate insulating layer 16 and a gate contact 17. For purposes of this disclosure, substrate structure 11 includes a substrate and may include one or more additional layers, such as epitaxial layers and the like, formed on the substrate. In many FETs, a channel layer is epitaxially grown on the substrate to provide a desired doping and, hence, a desired conductivity and such channel layers may or may not be considered as a portion of the substrate structure. Further, substrate structure 11 is illustrated as a single layer in FIG. 1 to simplify the drawings and explanation, since all such additional layers are not relevant to this invention.

As illustrated in FIG. 1, source 12 and drain 13 are spaced apart on the substrate structure to define a gate area therebetween. Layer 16 includes a laterally strained, enhanced dielectric constant dielectric material grown on the substrate structure in the gate area. The term 'laterally strained' in this disclosure means that layer 16 is strained in a direction generally parallel to the surface of substrate structure 11, or in a direction parallel to the gate area defined between source 12 and drain 13. It will of course be understood by those skilled in the art that source 12, drain 13, and gate 15 can be formed in any 7 sequence and there is no intent to limit the present disclosure to any specific sequence of steps in the formation of these terminals.

Figure 2:
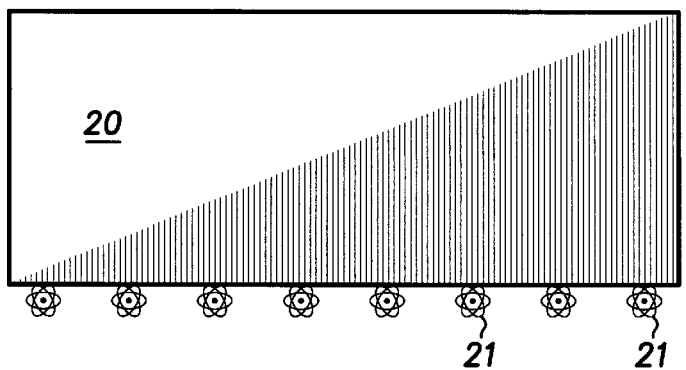
FIG. 2 illustrates a sectional view of an unstrained layer of dielectric material.
Figure 3:
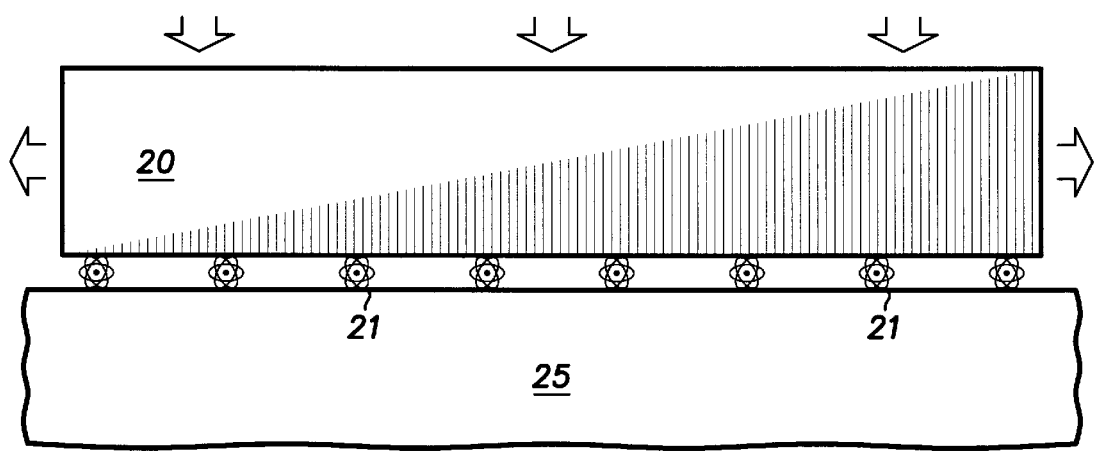
FIG. 3 illustrates a sectional view of a laterally strained layer of dielectric material.

Referring specifically to FIG. 2, a sectional view of a layer 20 of unstrained dielectric material is illustrated. Greatly enlarged atoms 21 are illustrated on the lower surface of layer 20 to illustrate a normal position or spacing of atoms 21 in an unstrained crystallographic orientation. Referring specifically to FIG. 3, layer 20 of the same dielectric material is illustrated crystallographically attached to the surface of a second material 25. In this example, the atoms of material 25 (not shown) are spread apart farther than the spacing of atoms 21 of layer 20 (shown in FIG. 2) so that in order to crystallographically bind the two materials together (such as in epitaxial growth) atoms 21 of layer 20 are spread laterally, in this specific example introducing lateral tension or tensile strain into layer 20. If the atoms of material 25 are closer together than the spacing of atoms 21 of layer 20 so that in order to crystallographically bind the two materials together (such as in epitaxial growth) atoms 21 of layer 20 are forced closer together, a lateral compressive strain is introduced into layer 20.

Also, the dielectric constant in the vertical direction of unstrained layer 20 in FIG. 2 is a specific value, depending upon the material included in layer 20. Introducing lateral strain into layer 20 as illustrated in FIG. 3, increases the dielectric constant in the vertical direction. It will of course be understood that increasing crystallographic strain, or lattice mismatch between layers of material will eventually result in broken bonds and other imperfections which will reduce the effectiveness of the strain and, eventually, render the interface unacceptable for use in semiconductor devices. Thus, the materials in the layers forming the interface should be stoichiometrically selected or adjusted during growth to provide the desired strain.

In a preferred method of fabricating an enhanced dielectric constant gate insulator for a field effect transistor a silicon substrate structure is provided. Spaced apart source and drain areas are defined on the surface of the substrate structure with a gate area therebetween. A layer of (CaSr)TiO$_3$ is epitaxially grown on the surface of the substrate structure in at least the gate area. By stoichiometrically adjusting the materials (e.g. the Ca/Sr ratio) during epitaxial growth, the layer of (CaSr)TiO$_3$ can be made to have lateral tensile or compressive strain which will substantially increase the dielectric constant of the layer of (CaSr)TiO$_3$. Generally it has been determined that a dielectric constant of at least 25 provides a gate insulator which substantially improves the characteristics for a field effect transistor.

In a specific example, the layer of (CaSr)TiO$_3$ is epitaxially grown on the silicon substrate at an elevated temperature in a normal epitaxial procedure. The Ca/Sr ratio is adjusted or tailored so that the (CaSr)TiO$_3$ and the silicon are substantially lattice matched (i.e. substantially no strain at the interface) at the temperatures used during the epitaxial growth. The structure is then cooled to ambient, or operating temperature and the difference in coefficients of expansion between silicon and (CaSr)TiO$_3$ produces the desired strain in the layer of (CaSr)TiO$_3$.

Figure 4:
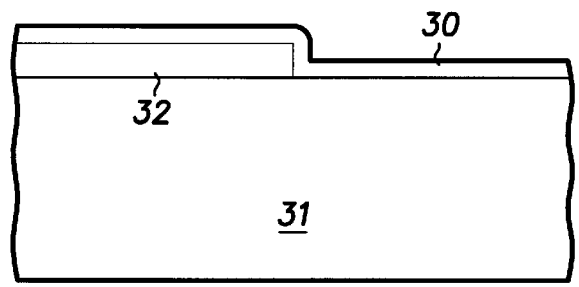
FIG. 4 illustrates a simplified sectional view of another embodiment of the invention.

Turning now to FIG. 4, a simplified sectional view of another embodiment of a strained layer 30 of dielectric material with an increased dielectric constant on the surface of a substrate structure 31 is illustrated. In this specific embodiment, a layer 32 of ferroelectric material is formed on substrate structure 31 and patterned to define a ferroelectric gate or gates for ferroelectric FETs, in a manner known in the art. As is also known in the art, standard FETs are generally used to control ferroelectric FETs. By depositing layer 32 of ferroelectric material onto substrate structure 31 first, it can be patterned in a normal operation for the formation of ferroelectric FETs. The deposition of strained layer 30 of dielectric material onto the surface of substrate structure 31 allows the convenient fabrication of improved FETs for controlling the ferroelectric FETs.

Further, by depositing strained layer 30 of dielectric material in a blanket layer over layer 32 of ferroelectric material, as well as the exposed surface of substrate structure 31, the process is simplified and strained layer 30 of dielectric material in combination with layer 32 of ferroelectric material can be used as a signal conveyance layer in the ferroelectric FETs. Also, the strain in layer 30 can compensate for lateral strain in layer 32 of ferroelectric material, thus relieving stress from the interface between substrate structure 30 and layer 32 of ferroelectric material. See for example, copending U.S. patent application entitled "Reduced Dimensionality and Preferentially Oriented Ferroelectric Device", filed Sep. 22, 1997, Ser. No. 08/935,318, and included herein by reference.

Thus, a new method of manufacturing enhanced dielectric constant dielectric material for FET gates is disclosed, along with new and improved FETs. The new method of fabricating dielectric material provides lateral strain in the layer of dielectric material that increases the dielectric constant. In a specific example, a high dielectric constant (CaSr)TiO$_3$ is epitaxially grown on a silicon substrate in a FET gate. FETs manufactured in accordance with the disclosed new methods have higher gain, lower gate leakage, and lower resistance than conventional FETs.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A field effect transistor with an enhanced dielectric constant gate insulator comprising:

a substrate structure having a first coefficient of thermal expansion;

spaced apart source and drain terminals positioned on the substrate structure defining a gate area therebetween;

a layer of laterally tension strained, enhanced dielectric constant dielectric material including (CaSr)TiO$_3$ grown epitaxially on the substrate structure in the gate area, the dielectric material having a second coefficient of thermal expansion that is different from the first coefficient for imparting lateral strain to the layer upon cooling from temperatures used for epitaxial growth, said substrate structure and said dielectric material being substantially lattice matched to each other at temperatures used for the epitaxial growth; and gate metal positioned on the layer of dielectric material to form a gate terminal in the gate area.

2. A field effect transistor with an enhanced dielectric constant gate insulator as claimed in claim 1 wherein the substrate structure includes a silicon substrate.

3. A field effect transistor with an enhanced dielectric constant gate insulator as claimed in claim 1 wherein the dielectric constant of the dielectric material is at least 25.

4. A field effect transistor with an enhanced dielectric constant gate insulator as claimed in claim 1 wherein the layer of dielectric material is an epitaxial layer and the stoichiometry of the layer of dielectric material is adjusted during epitaxial growth to provide the strain.

5. A transistor of claim 1 wherein said layer of dielectric material is a blanket layer.

6. A transistor of claim 1, further comprising a layer of ferroelectric material patterned to define a gate.

7. A ferroelectric field effect transistor, comprising:

a substrate structure having a first coefficient of thermal expansion;

a layer of ferroelectric material on said substrate structure patterned to define a ferroelectric gate;

a blanket layer of laterally strained, enhanced dielectric constant dielectric material including (CaSr)TiO$_3$ grown epitaxially on the substrate structure and ferroelectric gate, the dielectric material having a second coefficient of thermal expansion that is different from the first coefficient for imparting lateral strain to the layer, said substrate structure and said dielectric material being substantially lattice matched to each other at temperatures used for the epitaxial growth.

8. A field effect transistor with an enhanced dielectric constant gate insulator comprising:

a silicon substrate;

spaced apart source and drain terminals positioned on the substrate structure defining a gate area therebetween;

a layer of laterally tension strained, enhanced dielectric constant dielectric material including (CaSr)TiO$_3$ grown directly on the silicon substrate in the gate area; and gate metal positioned on the layer of dielectric material to form a gate terminal in the gate area.

* * * * *